United States Patent [19]
Sakamoto

[11] 3,903,490
[45] Sept. 2, 1975

[54] CONTROL DEVICE FOR AN AUTOMATIC TELEVISION CHANNEL SELECTOR

[75] Inventor: Yoichi Sakamoto, Takatsuki, Japan

[73] Assignee: Matsushita Electric Industrial Co., Ltd., Kadoma, Japan

[22] Filed: Mar. 13, 1974

[21] Appl. No.: 450,667

[30] Foreign Application Priority Data

Mar. 28, 1973 Japan ............................... 48-35437

[52] U.S. Cl. ................ 334/15; 307/223 R; 307/308
[51] Int. Cl.[2] ...................... H03H 5/12; H03K 23/02
[58] Field of Search ...... 334/15; 307/215, 223, 232, 307/308; 328/96

[56] References Cited

UNITED STATES PATENTS

| | | | |
|---|---|---|---|
| 3,103,632 | 9/1963 | Kaiser, Jr. | 328/96 |
| 3,581,108 | 5/1971 | Eisenmenger | 307/215 |
| 3,654,557 | 4/1972 | Sakamoto et al. | 334/15 |

*Primary Examiner*—Alfred E. Smith
*Assistant Examiner*—Wm. H. Punter
*Attorney, Agent, or Firm*—Burgess Ryan and Wayne

[57] ABSTRACT

A channel selector tuner of the type using as a channel selecting element a varicap diode includes a selection circuit adapted to change the state of a controlled unit, a clock pulse generator, a stepping switch circuit actuable in response to the output pulses from the clock pulse generator so as to control a stepping switch thereby switching the controlled unit into a specified state, and a group of switches. The logic sum of the outputs of the switches is applied as one input to a NAND gate. The logic products of the outputs of the switches and their associated outputs of the stepping switch circuit are applied as inputs to a NOR gate. The output of the NOR gate is applied as the other input to the NAND gate. In response to the NAND gate the clock pulse generator is controlled.

10 Claims, 5 Drawing Figures

PATENTED SEP 2 1975 3,903,490

SHEET 3 OF 5

CONTROL DEVICE FOR AN AUTOMATIC TELEVISION CHANNEL SELECTOR

BACKGROUND OF THE INVENTION

The present invention relates to a control device which may be used as a channel selector of a television receiver.

There has been recently devised and demonstrated a channel selector for a television receiver of the type selecting a desired channel by actuating one of a plurality of switches. However, the channel selector or the type has a defect that when more than two channel selection switches are simultaneously actuated, no channel is selected, or an undesired channel is selected.

SUMMARY OF THE INVENTION

One of the objects of the present invention is therefore to provide a control device which may always accomplish the correct operation even when two or more than two switches are simultaneously actuated.

Another object of the present invention is to provide a control device which may be used as a channel selector of a television receiver, and may find wide applications such as a volume control of a radio.

The control device in accordance with the present invention includes a selection circuit adapted to change the state of a controlled unit, a stepping switching means adapted to control the selection circuit so to bring the controlled unit into a specified state, a clock pulse generator for driving the stepping switching means, and a plurality of switches. The logic sum of the outputs of the switches is applied as one input to a NAND gate. The logic products of the outputs of the switches and their associated outputs of the stepping switching means are applied to the input terminals of a NOR gate. The output of the NOR gate is applied as the other input to the NAND gate. The clock pulse generator is controlled in response to the output of the NAND gate.

The above and other objects, features and advantages of the present invention will become more apparent from the following description of the preferred embodiments thereof taken in conjunction with the accompanying drawing.

BRIEF DESCRIPTION OF THE DRAWING

The same reference numerals are used to designate like parts throughout the figures.

DESCRIPTION OF THE PREFERRED EMBODIMENTS

Figure 1:
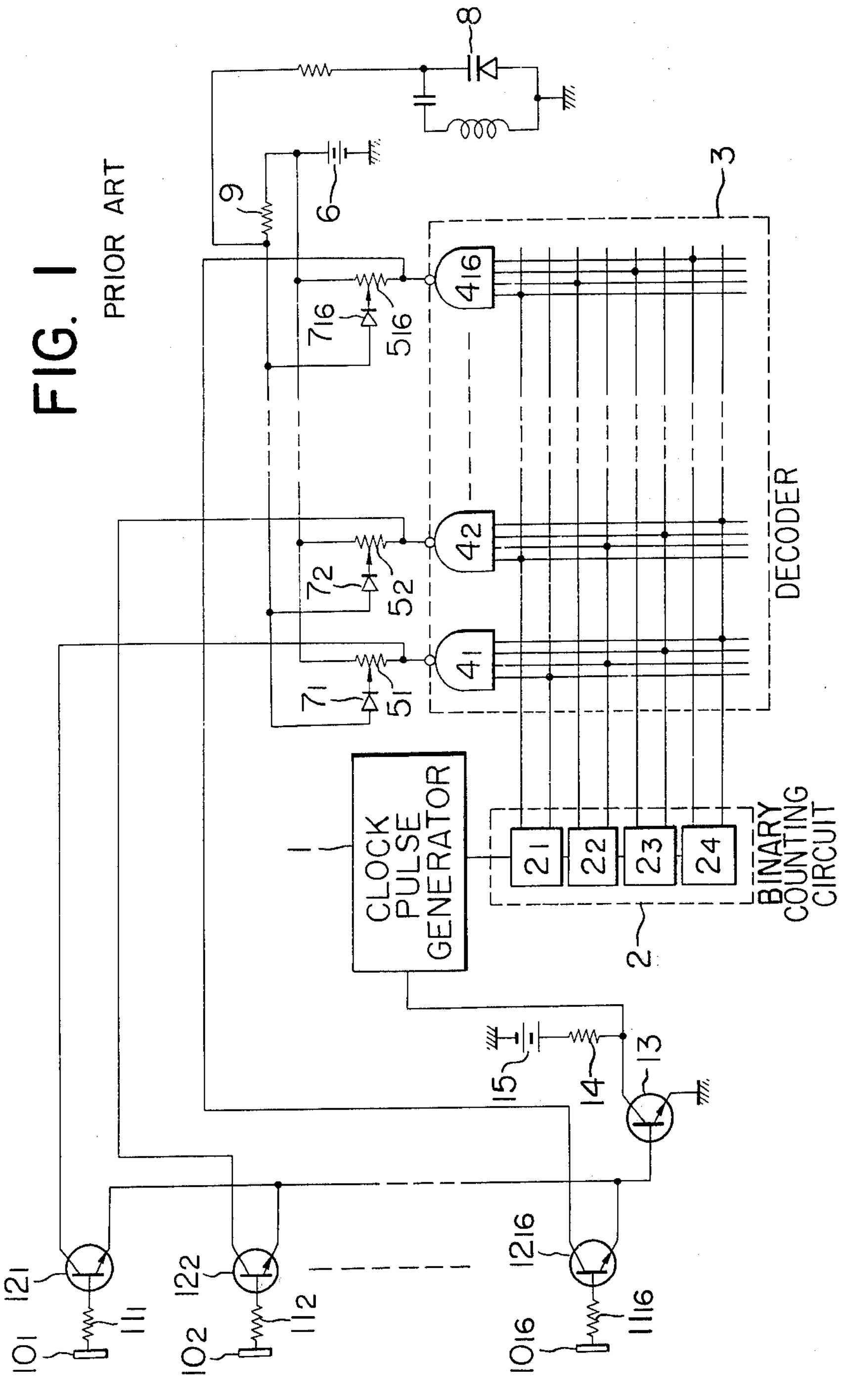
FIG. 1 PRIOR ART
FIG. 1 is a circuit diagram of a conventional channel selector.

Prior Art, FIG. 1

FIG. 1 is a circuit diagram of a conventional channel selector in which a binary counter or counting circuit 2 comprising flip-flops $2_1$, $2_2$, $2_3$ and $2_4$ is driven in response to the pulses from a clock pulse generator 1. A decoder 3 comprising NAND gates $4_1$, $4_2$, $4_3$, ..., and $4_{16}$ provides an output representing the output of the binary counting circuit 2, so that the output 0 or low level signal is derived from one of the NAND gates $4_1$ – $4_{16}$, and the outputs 1s or high-level signals are derived from all of the remaining NAND gates. That is, in response to the output of the binary counter 2 one of the NAND gates $4_1$ – $4_{16}$ provides an output 0. Variable resistors $5_1$ – $5_{16}$ are inserted between the output terminals of the NAND gates $4_1$ – $4_{16}$ and a DC power supply 6, respectively, and the armatures of these variable resistors $5_1$ – $5_{16}$ are connected through diodes $7_1$ – $7_{16}$ to a varicap diode 8 in a tank circuit of a tuner. The anodes of the diodes $7_1$ – $7_{16}$ are connected through a common resistor 9 to the DC power supply 6.

Touch plates $10_1$ – $10_{16}$ for channel selection are connected to the bases of switching transistors $12_1$ – $12_{16}$ through resistors $11_1$ – $11_{16}$, respectively. The collectors of the switching transistors $12_1$ – $12_{16}$ are connected to the output terminals of the NAND gates $4_1$ – $4_{16}$, respectively, while the emitters thereof are connected to the base of a switching transistor 13 whose emitter is grounded, and whose collector is connected through a resistor 14 to a DC power supply 15 and to the input terminal of the clock pulse generator 1.

Next the mode of operation will be described. When the output 0 is derived from the NAND gate $4_1$ while the outputs 1s are derived from the remaining NAND gates $4_2$ – $4_{16}$, the channel selection control voltage derived from the variable resistor $5_1$ is applied through the diode $7_1$ to the varicap diode 8 so that the desired channel is selected. When it is desired to select another channel, one touches the touch plate $10_{16}$. Then, ambient noise is applied to the base of the transistor $12_{16}$ so that the latter conducts. Therefore, the transistor 13 also conducts so that the input 0 is applied to the clock pulse generator. The pulse generator 1, in response to the 0 input provides clock pulses to the binary counter 2. Then the NAND gates $4_1$, $4_2$, ..., and $4_{16}$ successively provide the outputs 0. When the output 0 is derived from the NAND gate $4_{16}$, the transistor $12_{16}$ is turned off so that the transistor 13 is also turned off. Then, the input 1 is applied to the clock pulse generator 1 so that the latter is deactivated. The binary counter 2 is also deactivated, and the successive generation of 0 by the NAND gates $4_1$ – $4_{16}$ is interrupted. The control voltage for selecting the channel corresponding to the touch plate $10_{16}$ is derived from the variable resistor $5_{16}$ and applied to the varicap diode 8 so that the desired channel is selected.

One of the defects of the above described prior art channel selector is that when a plurality of touch plates or switches are touched simultaneously, no channel selection operation is carried out. Assume that when the channel associated with the touch plate $10_{16}$ is selected, one touches both touch plates $10_1$ and $10_2$. Then, both the transistors $12_1$ and $12_2$ conduct, and the transistor 13 also conducts. As a result, the clock pulse generator 1 and the binary counter 2 are activated so that the 0 output is successively derived from the NAND gates $4_{16}$ and $4_1$. When the 0 output is derived from the NAND gate $4_1$, the transistor $12_1$ is turned off, but the transistor $12_2$ remains conducting so that the transistor 13 also conducts. Therefore, the 0 output is also derived from the NAND gate $4_2$ so that the transistor $12_2$ is turned off while the transistor $12_1$ conducts again. Thus, the 0 output is successively derived from the NAND gates $4_1$ – $4_{16}$. That is, the 0 output is continuously circulating through the NAND gates $4_1$ – $4_{16}$. The present invention was made to overcome the above and other inherent defects encountered in the conventional channel selectors.

Figure 2:
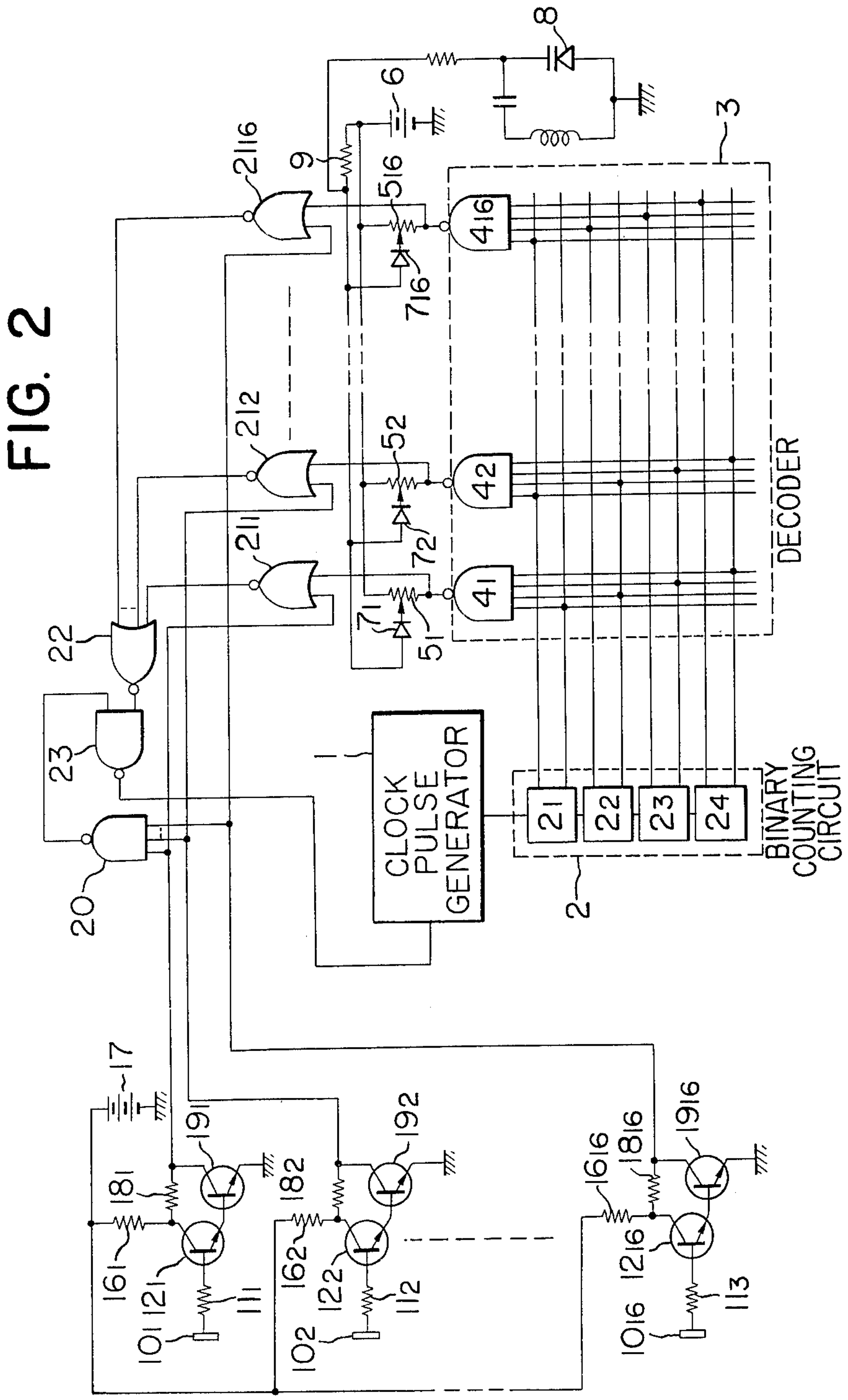
FIGS. 2–5 are schematic circuit diagrams of the first to fourth embodiments of a control device in accordance with the present invention.

First Embodiment, FIG. 2

The collectors of the transistors $12_1 - 12_{16}$ are all connected to a DC power supply 17 through collector resistors $16_1 - 16_{16}$, respectively, and to the collectors of transistors $19_1 - 19_{16}$ through resistors $18_1 - 18_{16}$. The emitters of the transistors $19_1 - 19_{16}$ are grounded while the bases are connected directly to the emitters of the transistors $12_1 - 12_{16}$, respectively. The collectors of the transistors $19_1 - 19_{16}$ are connected to a NAND gate 20 and to one input terminals of NOR gates $21_1 - 21_{16}$, respectively. NOR gates $21_1$ to $21_{16}$ provide NOR gate 23 with the logical products of switches $10_1 - 10_{16}$ and their associated outputs of NAND gates $4_1 - 4_{16}$. The other input terminals of the NOR gates $21_1 - 21_{16}$ are connected to the output terminals of the NAND gates $4_1 - 4_{16}$, respectively, of the decoder 3. Thus, binary counting circuit 2 and decoder 3 constitute a stepping switching means. The output terminals of the NOR gates $21_1 - 21_{16}$ are connected to the input terminals of a NOR gate 22, whose output terminal is connected to one input terminal of a NAND gate 23. The other terminal of NAND gate 23 is connected to the output terminal of the NAND gate 20 while the output terminal of NAND gate 23 is connected to the input terminal of the clock pulse generator 1.

Next the mode of operation will be described. When one channel is being received and when one does not touch any of the touch plates $10_1 - 10_{16}$, the input signals 1s are applied to all of the input terminals of the NAND gate 20 so that the output of the NAND gate 20 applied to the one input terminal of the NAND gate 23 is 0. Therefore, the output of the NAND gate 23 applied to the clock pulse generator 1 is 1.

When one touches the touch plate $10_{16}$ in order to select a channel associated therewith, the transistors $12_{16}$ and $19_{16}$ conduct so that the input 0 is applied to one of the input terminals of the NAND gate 20. Therefore, the output of the NAND gate 20 applied to the one input terminal of the NAND gate 23 turns to 1. The output of the transistors $19_{16}$ is applied to the NOR gate $21_{16}$, but the output thereof is 0 because the output of the NAND gate $4_{16}$ is not 0 unless a desired channel is selected. Since the input signals 1s are applied to at least one input terminals of the NOR gates $21_1 - 21_{15}$, their outputs are all 0s. Therefore, the input signals 0s are applied to all input terminals of the NOR gate 22 so that the output of the NOR gate applied to the other input terminal of the NAND gate 23 is 1. Then, the output of the NAND gate 23 applied to the clock pulse generator 1 changes to 0 so that the clock pulse generator 1 is energized to generate the clock pulses.

In response to the clock pulses, the output 0 is successively derived from the NAND gates $4_1 - 4_{16}$. When the output 0 is derived from the NAND gate $4_{16}$, the 0 input signals are applied to both input terminals of the NOR gate $21_{16}$ so that the output 1 is derived. Therefore, the output 0 is derived from the NOR gate 22 and is applied to the NAND gate 23. The output 1 is derived from the NAND gate 23 so that the clock pulse generator 1 is deactivated. Thus, the channel selection operation is accomplished.

Next assume that both of the touch plates $10_1$ and $10_2$ are touched while the channel associated with the touch plate $10_{16}$ is received. Then the clock pulses are generated in the manner described above, and when the 0 output is derived from the NAND gate $4_1$, both inputs to the NOR gate $21_1$ become 0s so that the output 1 is derived from the NAND gate 23, and applied to the clock pulse generator 1. Therefore, the gate pulse generator 1 is deactivated so that the channel associated with the touch plate $10_1$ is selected. Even when one touches the touch plate $10_2$, the clock pulse will not be generated as long as the output 1 is derived from the NOR gate $21_1$. In summary, when a plurality of touch plates 10 are touched simultaneously, the channel associated with one of the NAND gate $4_1 - 4_{16}$ from which the first 0 output is derived is selected.

As is known in the art a NAND gate is merely an AND gate with an inverted output. A NAND gate therefore performs an AND function, and is essentially an AND gate. Thus, while in the above example, the clock pulse generator 1 provides pulses in response to a logical 0 and is therefore connected to the output of NAND gate 23, if clock pulse generator 1 were to be of the type that provides pulses when the input signal 1 was applied to the input terminal thereof, and when the input signal 0 is applied, the clock pulse generator 1 was deactivated, the NAND gate 23 could be replaced by an AND gate because the output of the NAND gate 23 is the negation of the output of an AND gate. Therefore, as used hereinafter, the term NAND gate may be alternately interpreted as AND gate, it being understood that this alternate interpretation also necessitates that the devices connected to the output thereof must be of the type that respond inversely to logical signals. In the first embodiment shown in FIG. 2, the output of the binary counter 2 has been described as being four bits and the number of channels to be selected, as being 16, but it is to be understood that they may be suitably changed in number depending upon the demands. It should be also noted that the switching circuit may be replaced by any other suitable circuit.

Figure 3:
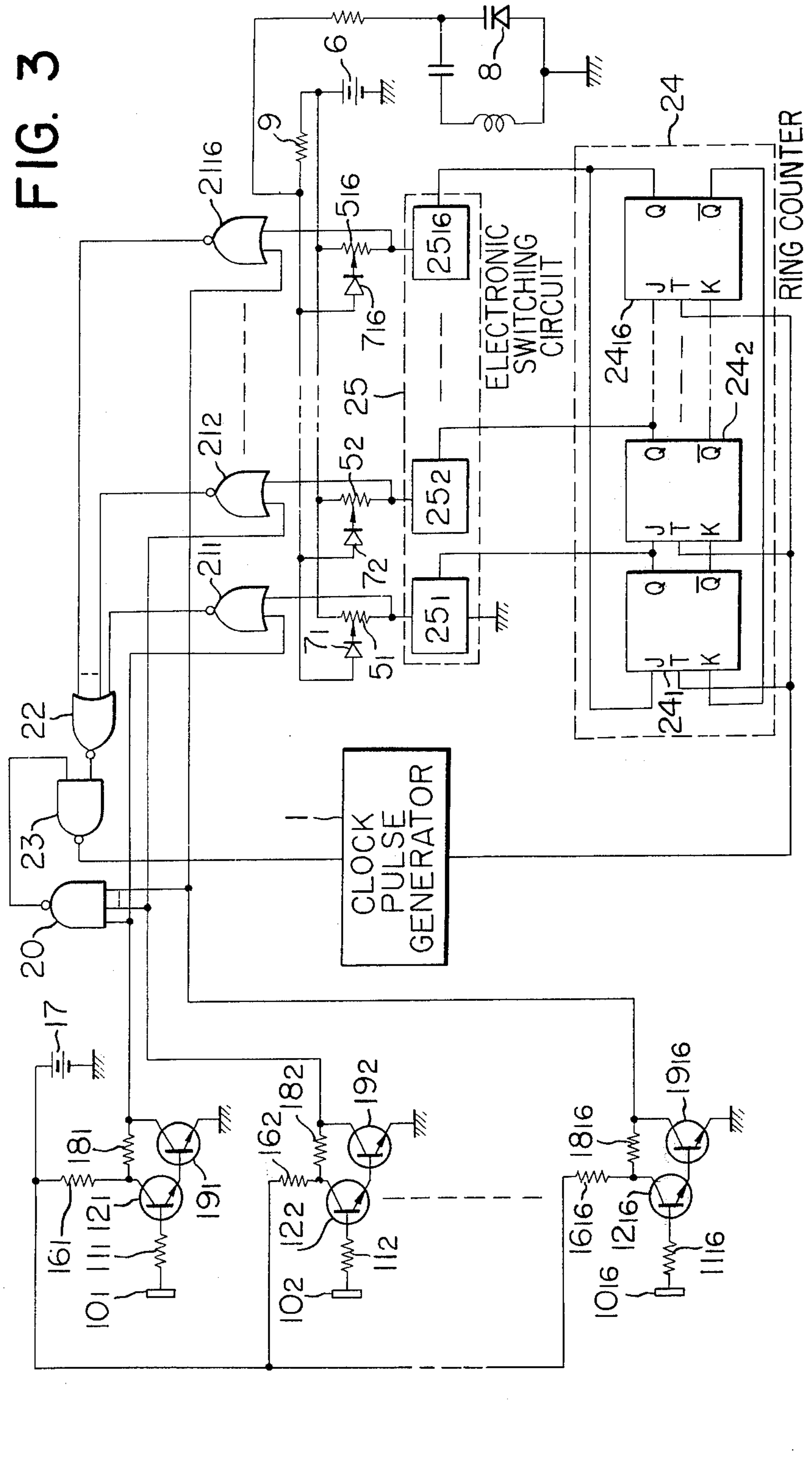

Second Embodiment, FIG. 3

The second embodiment shown in FIG. 3 is substantially similar in construction to the first embodiment shown in FIG. 2 except that the binary counter 2 is replaced by a ring counter 24, and the decoder 3 is replaced by an electronic switching circuit 25. The ring counter 24 comprises a plurality of flip-flops $24_1 - 24_{16}$ interconnected in such a way that only one is in a specified state at any given time, and as the output pulses from the clock pulse generator 1 are counted, the specified state moves in an ordered sequence around the loop. The electronic switching circuit 25 comprises a plurality of switching circuits $25_1 - 25_{16}$ inserted between ground and the grounding terminals of the variable resistors $5_1 - 5_{16}$ so that only one switching circuit conducts in response to the output of one of the flip-flops $24_1 - 24_{16}$ which is in a specified state. Therefore, one end of the associated variable resistor is grounded.

Since the mode of operation is substantially similar to that of the first embodiment and is readily understood to those skilled in the art, its description will not be made in this specification. It is a matter of change in design to increase or reduce the number of flip-flops in the ring counter 24, which is 16 in the second embodiment, and to replace the switching circuits by any suitable circuits.

Figure 4:
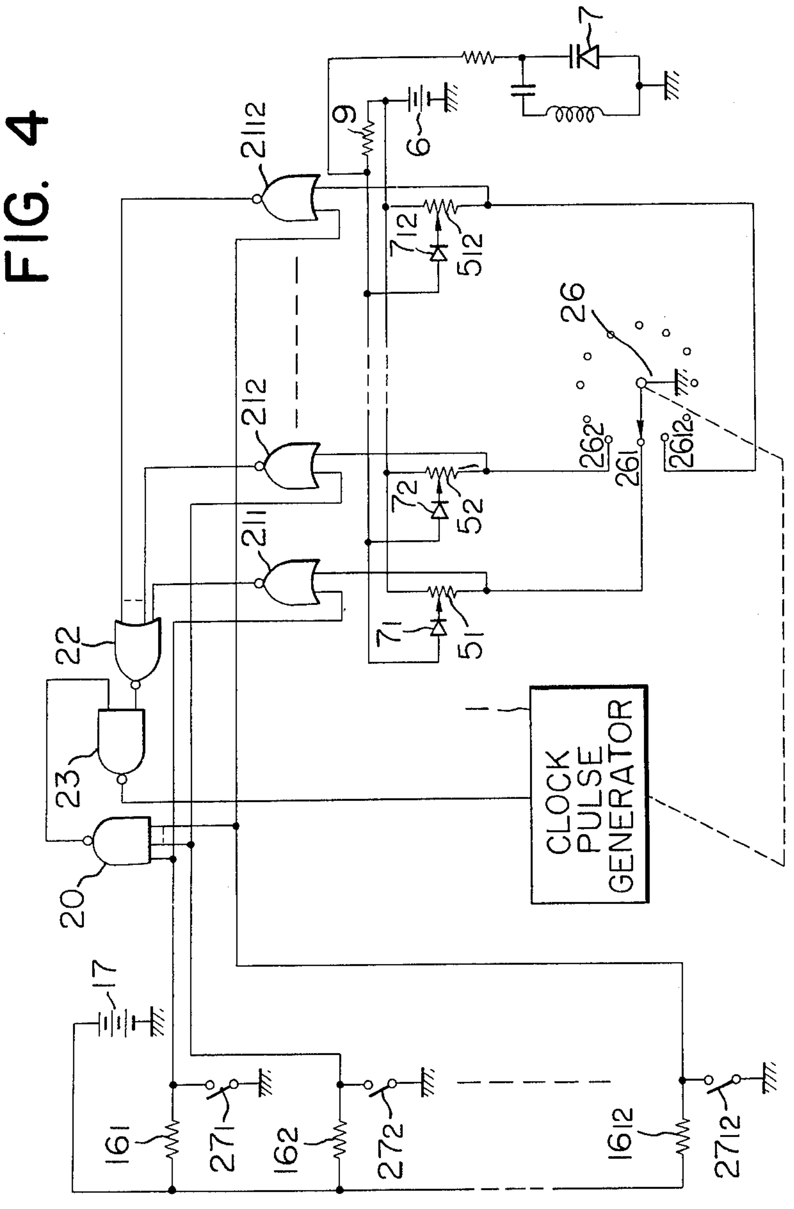

Third Embodiment, FIG. 4

In the third embodiment shown in FIG. 4, instead of the stepwise switching means consisting of the binary counter and the decoder in the first embodiment, or the electronic switching circuit and the ring counter in the second embodiment, a motor-driven selection switch 26 is used. The terminals $26_1$ – $26_{12}$ of the stepping switch 26 are connected to the grounding terminals of the variable resistors $5_1$ – $5_{12}$, while the armature or moving arm of the switch 26 is grounded. The armature of the stepping switch 26 contacts the fixed terminals $26_1$ – $26_{12}$ in a stepwise manner in response to the clock pulses from the clock pulse generator 1. In the third embodiment, one of the variable resistors $5_1$ – $5_{12}$ is selectively grounded. Thus, the mode of operation of the third embodiment is substantially similar to that of the first or second embodiment.

In the third embodiment, instead of the touch plates $10_1$ – $10_{12}$, and the transistors $12_1$ – $12_{12}$ and $19_1$ – $19_{12}$, switches $27_1$ – $27_{12}$ are used, but the mode of operation is substantially similar to that of the first and second embodiment, except that the channel selection by the third embodiment requires a time longer than the instantaneous channel selection time accomplished by the first and second embodiment.

Figure 5:
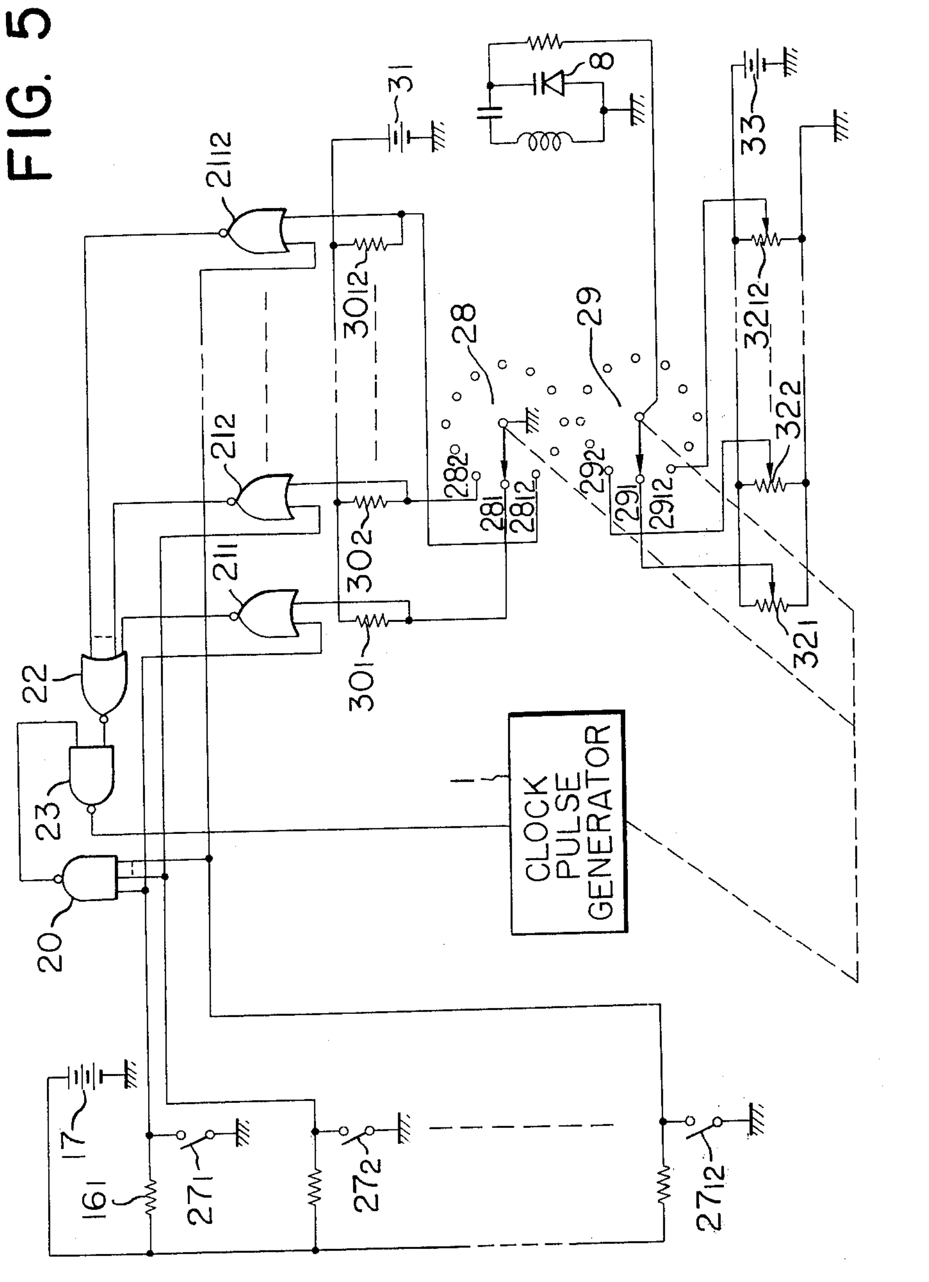

Fourth Embodiment, FIG. 5

The fourth embodiment shown in FIG. 5 is substantially similar in construction to the third embodiment shown in FIG. 4, except two motor-driven stepping switches 28 and 29 are used instead of only one stepping switch 26 in the third embodiment. The fixed contacts or terminals $28_1$ – $28_{12}$ of one stepping switch 28 are connected to one input terminals of the NAND gates $21_1$ – $21_{12}$ and to a DC power supply 31 through fixed resistors $30_1$ – $30_{12}$, respectively. The fixed contacts or terminals $29_1$ – $29_{12}$ of the other stepping switch 29 are connected to the armatures of variable resistors $32_1$ – $32_{12}$ for presetting, respectively. Resistors $32_1$ – $32_{12}$ are connected to another DC power supply 33. The mode of operation of the fourth embodiment is substantially similar to that of the third embodiment so that no description will be made in this specification.

The channel selectors in accordance with the present invention described hereinbefore will operate even when the output of various components such as transistors $19_1$ – $19_{16}$, switches $27_1$ – $27_{12}$, the decoder 3, the electronic switching circuit 25, and the stepping switches 26, 27 and 28 are reversed. The output of the NAND gate 20 is the logic sum of the negation of the inputs, and the output of the NOR gate $21_1$ – $21_{16}$ is the logic product of the negation of the inputs. The inputs to the NAND gate 20 and the NOR gates $21_1$ – $21_{16}$ are the negations or NOTs of the outputs of the transistors $19_1$ – $19_{16}$ or the switches $27_1$ – $27_{12}$, and the NAND gates $21_1$ – $21_{16}$. Therefore, when the logic outputs of the transistors $19_1$ – $19_{16}$ or the switches $27_1$ – $27_{12}$, the decoder 3 or the electronic switching circuit 25 or stepping switch or switches 26 or 27 and 28 are reversed and when the logic elements in the first, second, third and fourth embodiments shown in FIGS. 2, 3, 4 and 5, respectively, are replaced, the channel selector in accordance with the present invention may be defined as comprising a tuner including varicap diode inserted in a tank circuit as a channel selection element; a plurality of variable resistors for applying preset channel selection control voltages to said varicap diode; stepping means for switching said plurality of variable resistors in such a way that a specified channel selection control voltage may be applied to said varicap diode; a clock pulse generator for generating the clock pulses, in response to each of which said stepping means switches said plurality of variable resistors; a switch inserted in each channel; the logic sum of the outputs of said switches being applied to one input terminal of a NAND gate; the logic products of the outputs of said switches and the outputs of said stepping means being applied to the input terminals of a NOR gate; the output of said NOR gate being applied to the other input terminal of said NAND gate; said clock pulse generator being controlled in response to the output of said NAND gate; and in response to the output of said clock pulse generator said stepping means being controlled in such a way that a channel selection control voltage applied to said varicap diode in said tuner may be switched.

As described above, in the channel selector in accordance with the present invention, even when a plurality of channel selection switches or the like are simultaneously actuated, the channel selection may be accomplished.

What is claimed is:

1. A control device comprising a. a selection circuit with a plurality of control terminals and an output terminal connected to a control voltage input terminal of a controlled unit so as to control the state of said controlled unit;

b. stepping switching means with a plurality of output terminals connected to said plurality of control terminals of said selection circuit, a clock pulse generator and means changing the states of said plurality of stepping output terminals in response to each clock pulse which is the output of said clock pulse generator;

c. a plurality of switches;

d. a NOR gate to which are applied as input the logic products of the outputs of said plurality of switches and their associated outputs of said stepping switching means;

e. a NAND gate to which is applied the output of said NOR gate and the logic sum of all of the outputs of said plurality of switches, whereby said clock pulse generator is activated or deactivated in response to the output of said NAND gate.

2. A control device as defined in claim 1 wherein said selection circuit includes a plurality of variable presetting resistors having first terminals to which are applied to a DC voltage and armatures to which are connected diodes;

each of the junctions between said armatures of said plurality of variable resistors and said diodes is connected to said control voltage input terminal of said controlled unit, said controlled unit including a varicap diode connected to the control voltage input terminal thereof; and the other terminals of said plurality of variable resistors are connected to the output terminals of said stepping switching means.

3. A control device as defined in claim 2 wherein said controlled unit comprises a tuner having a tank circuit with said varicap diode inserted therein as a channel selection means; and one terminal of said varicap diode is said control voltage input terminal.

4. A control device as defined in claim 1 wherein said selection circuit comprises a. a plurality of variable presetting resistors with a DC voltage impressed between a pair of fixed terminals thereof, the armatures thereof being connected to the control voltage input terminal of said controlled unit in response to said stepping switching means, and b. a plurality of resistors having first terminals to which are applied a DC voltage and other terminals to which are connected the output terminals of said stepping switching means, whereby said stepping switching means may be actuated in response to the output of said clock pulse generator.

5. A control device as defined in claim 4 wherein said controlled unit comprises a tuner having a tank circuit with said varicap diode inserted as a channel selection element; and one terminal of said varicap diode is said control voltage input terminal.

6. A control device as defined in claim 1, wherein said stepping switching means comprises a. a binary counter for counting the clock pulses derived from said clock pulse generator, and b. a binary-radix *n* decoder whose input terminals are connected to the output terminals of said binary counter and whose output terminals are connected to said control terminals of said selection circuit.

7. A control device as defined in claim 1 wherein said stepping switching means includes a. a ring counter connected to said clock pulse generator so that the state of said ring counter may change in response to the output of said pulse generator, and b. a switching circuit adapted to selectively ground the control terminals of said selection circuit in response to the output of said ring counter.

8. A control device as defined in claim 1 wherein said stepping switching means includes a motor adapted to rotate in stepwise increments in response to the output pulses derived from said clock pulse generator, and a stepping switch which is driven by said motor and whose armature or moving wiper is grounded and whose fixed contacts are connected to a plurality of selection terminals of said selection circuit.

9. A control device as defined in claim 1 including a plurality of further NOR gates having first input terminals connected to a plurality of output terminals of said stepping switching means and other input terminals connected to the output terminals of said plurality of switches, said plurality of further NOR gates providing the logic product of each of the outputs of said plurality of switches and its associated output of said stepping switching means;

said NOR gate having input terminals connected to the output terminals of said plurality of NOR gates;

a first NAND gate (20) whose input terminals are connected to the output terminals of said plurality of switches to take the logic sum of the output of said switches; and a second NAND gate (23) having one input terminal connected to said NOR gate and another input terminal connected to the output terminal of said first NAND gate, whereby said clock pulse generator may be activated or deactivated in response to the output of said second NAND gate.

10. A control device as defined in claim 1 wherein said plurality of switches comprises a. a plurality of electrodes adapted to pick up hum of a power supply, and b. a transistor circuit comprising a plurality of transistors which are turned on or off in response to said picked-up hum.

* * * * *